United States Patent
Sonobe et al.

(10) Patent No.: US 6,191,437 B1
(45) Date of Patent: Feb. 20, 2001

(54) SEMICONDUCTOR LIGHT EMITTING DEVICE AND METHOD OF MANUFACTURING THE SAME

(75) Inventors: Masayuki Sonobe; Shunji Nakata; Tsuyoshi Tsutsui; Norikazu Itoh, all of Kyoto (JP)

(73) Assignee: Rohm Co., Ltd., Kyoto (JP)

( * ) Notice: Under 35 U.S.C. 154(b), the term of this patent shall be extended for 0 days.

(21) Appl. No.: 09/381,285

(22) PCT Filed: Jan. 21, 1998

(86) PCT No.: PCT/JP98/00251

§ 371 Date: Sep. 21, 1999

§ 102(e) Date: Sep. 21, 1999

(87) PCT Pub. No.: WO99/38218

PCT Pub. Date: Jul. 29, 1999

(51) Int. Cl.[7] .................................................. H01L 33/00
(52) U.S. Cl. .............................. 257/94; 257/96; 257/97; 257/103; 438/93; 438/94
(58) Field of Search ................................. 257/184, 183, 257/185, 200, 94, 95, 97, 103; 438/94, 93

(56) References Cited

U.S. PATENT DOCUMENTS 5,990,496 * 11/1999 Kunisato et al. ....................... 257/94

FOREIGN PATENT DOCUMENTS

09129927 * 5/1997 (JP) .
09186364 * 7/1997 (JP) .

OTHER PUBLICATIONS

Niebuhr et al., "Electrical and Optical Properties of Oxygen Doped GaN Grown by MOCVD Using $N_2O$," *Journal of Electronic Materials*, vol. 26, No. 10, pp. 1127–1130, 1997.*

Edwards et al., "Ion Implantation Doping of OMCVD Grown GaN", *Journal of Electronic Materials*, vol. 26, No. 3, pp. 334–339, 1997.*

Neugebauer et al., "Defects and Doping in GaN", $22^{nd}$ Int'l Conf. on The Physics of Semiconductors, vol. 3, pp. 2327–2330, 1994.*

* cited by examiner

*Primary Examiner*—William Mintel
(74) *Attorney, Agent, or Firm*—Arent Fox Kintner Plotkin & Kahn (57) ABSTRACT

An n-type layer (3) and a p-type layer (5) which are made of a gallium nitride based compound semiconductor are provided on a substrate (1) so that a light emitting layer forming portion (10) for forming a light emitting layer is provided. A gallium nitride based compound semiconductor layer containing oxygen is used for at least one layer of the light emitting layer forming portion (10). In the case where a buffer layer (2) made of the gallium nitride based compound semiconductor or aluminum nitride is provided between the substrate (1) and the light emitting layer forming portion (10), the buffer layer (2) and/or at least one layer of the light emitting layer forming portion (10) may contain oxygen. By such a structure, crystal defects of the semiconductor layer of the light emitting layer forming portion (10) can be decreased and a luminance can highly be enhanced. Thus, it is possible to obtain a blue color type semiconductor light emitting device having a high luminance.

22 Claims, 4 Drawing Sheets

SEMICONDUCTOR LIGHT EMITTING DEVICE AND METHOD OF MANUFACTURING THE SAME

TECHNICAL FIELD

The present invention relates to a semiconductor light emitting device in which a gallium nitride based compound semiconductor layer is provided on a substrate, thereby forming a light emitting diode and a semiconductor laser diode. More particularly, the present invention relates to a semiconductor light emitting device capable of reducing the influence of a shift of a crystal lattice between the substrate and the gallium nitride based compound semiconductor, thereby enhancing light emitting characteristics.

BACKGROUND ART

Figure 7:
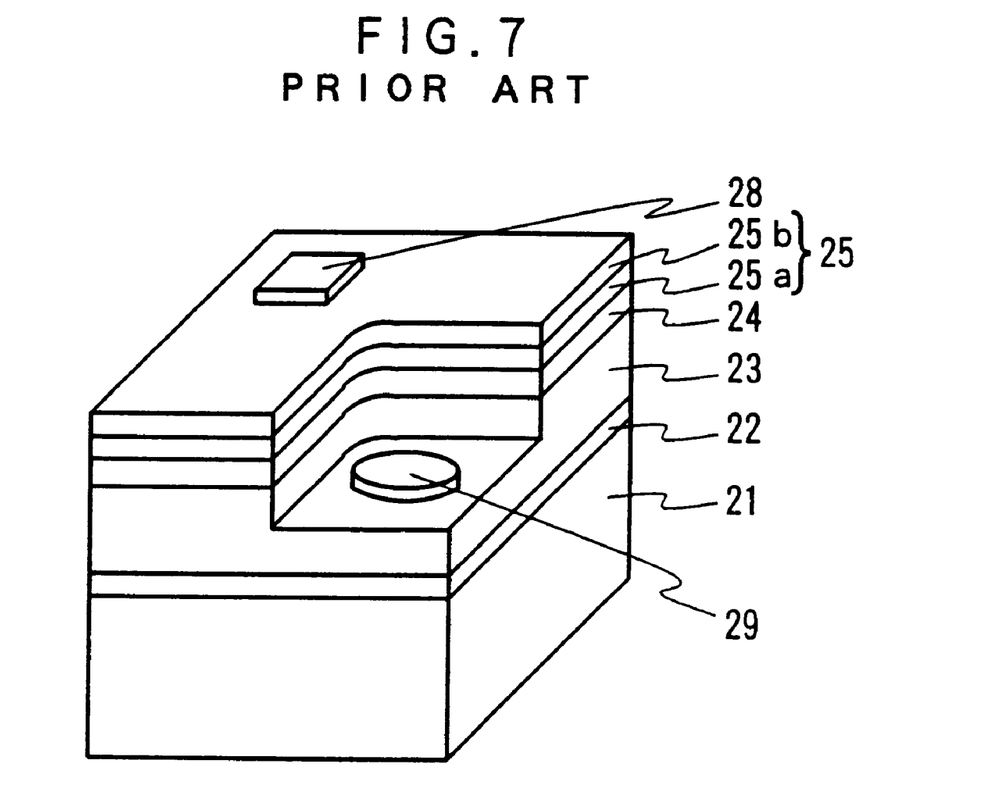
FIG. 7 is a perspective view showing an example of a semiconductor light emitting device using a gallium nitride based compound semiconductor according to the prior art.

Conventionally, a semiconductor light emitting device using a gallium nitride based compound semiconductor for emitting blue color type light (yellow from ultraviolet rays), for example, has had a structure shown in FIG. 7. More specifically, the semiconductor light emitting device comprises a low-temperature buffer layer 22 made of GaN on a sapphire substrate 21, for example, an n-type layer (a clad layer) 23 in which n-type GaN is epitaxially grown at a high temperature, an active layer 24 formed of a compound semiconductor made of a material for defining a light emitting wavelength to have a smaller band gap energy than the band gap energy of the clad layer, for example, an InGaN based compound semiconductor (which means that a ratio of In to Ga can be variously changed and so is the following), and a p-type layer (a clad layer) 25 including a p-type AlGaN based compound semiconductor layer 25a (which means that a ratio of Al to Ga can be variously changed and so is the following) and a GaN layer 25b, and a p-side electrode 28 is provided on the surface of the GaN layer 25b and an n-side electrode 29 is provided on the surface of the n-type layer 23 which is exposed by etching a part of the provided semiconductor layers. In some cases, the AlGaN based compound semiconductor layer is used on the active layer 23 side of the n-type layer 23 in the same manner as the p-type layer 25 in order to enhance the confinement effects of a carrier.

As described above, the conventional blue color type semiconductor light emitting device using the gallium nitride based compound semiconductor is formed by providing gallium nitride based compound semiconductors such as GaN, InGaN based and AlGaN based compound semiconductors which form a light emitting layer on the sapphire substrate. However, the lattice constant of the sapphire substrate is different from that of the gallium nitride based compound semiconductor by about 16%. Therefore, it is impossible to obtain a gallium nitride based compound semiconductor layer having excellent crystalline properties. In order to solve this problem, a buffer layer such as GaN, AlN or the like which is formed at a low temperature is provided between a single crystal layer of the gallium nitride based compound semiconductor forming a light emitting layer and a substrate, thereby enhancing the crystalline properties of the gallium nitride based compound semiconductor layer as described above.

Although the crystalline properties of the light emitting layer can be improved and the blue color type semiconductor light emitting device can be utilized by providing the above-mentioned buffer layer to be formed at a low temperature, the problem of the crystal defect of the gallium nitride based compound semiconductor layer has not completely been solved. There has been a problem in that a luminance cannot fully be enhanced due to a great leakage current and yield cannot be enhanced due to an insufficient luminance obtained by a slight change in a manufacturing process.

In order to solve the above-mentioned problems, it is an object of the present invention to provide a semiconductor light emitting device having gallium nitride based compound semiconductor layers provided in which crystal defects based on a difference in a lattice constant can be decreased, a leakage current can be reduced and an excellent light emitting efficiency can be obtained.

It is another object of the present invention to provide a method for manufacturing a semiconductor light emitting device in which the crystal defects can be decreased based on the difference in the lattice constant when the gallium nitride based compound semiconductor layers are to be provided.

DISCLOSURE OF THE INVENTION

The present inventors made various investigations in order to decrease crystal defects of semiconductor layers to reduce a leakage current and to enhance a luminance when a light emitting layer forming portion made of gallium nitride based compound semiconductor layers is to be provided. As a result, it has been found that at least one of the gallium nitride based compound semiconductor layers constituting the light emitting layer forming portion is caused to contain oxygen, thereby decreasing a crystal defect density and enhancing a luminance. Moreover, the following has been found. In the case were one semiconductor layer is caused to contain oxygen, it is provided on the underside as much as possible, thereby decreasing the crystal defects of the semiconductor layer provided thereon to enhance a luminance. In the case where a buffer layer made of a gallium nitride based compound semiconductor is provided between the substrate and the light emitting layer forming portion, the crystal defects of the semiconductor layer provided on the buffer layer can be improved even if the buffer layer contains oxygen. Furthermore, it has been found that in the case where the buffer layer is made of AlN, the crystalline properties can be improved even if the AlN is caused to contain oxygen and can be improved still more by causing a plurality of layers to contain oxygen.

The present invention provides a semiconductor light emitting device comprising a substrate, a buffer layer provided on the substrate and made of a gallium nitride based compound semiconductor, and a light emitting layer forming portion in which a gallium nitride based compound semiconductor including an n-type layer and a p-type layer to form a light emitting layer is provided on the buffer layer, wherein the buffer layer or at least one of semiconductor layers constituting the light emitting layer forming portion is a compound semiconductor which contains oxygen in a gallium nitride based compound.

The gallium nitride based compound semiconductor means a semiconductor made of a compound of III group element Ga and V group element N, or a compound obtained by substituting a part of the III group element Ga for another III group element such as Al, In or the like and/or by substituting all or a part of the V group element N for another V group element such as P, As or the like.

The compound semiconductor containing the oxygen is made of $Ga_{1-x-y}Al_xIn_yO_zN_{1-z}$ ($0 \leq x < 1, 0 \leq y < 1, 0 < z < 1$). The compound semiconductor containing the oxygen may contain an n-type impurity and/or a p-type impurity. The n-type impurity means at least one kind of Si, Se, Te and the like, and the p-type impurity means at least one kind of Mg, Zn, Be and the like.

Furthermore, the compound semiconductor containing the oxygen is used for the buffer layer, is used for a semiconductor layer on at least the buffer layer side of the light emitting layer forming portion, is used for the active layer interposed between the n-type layer and the p-type layer constituting the light emitting layer forming portion, or is used for two layers or more such as the buffer layer and the semiconductor layer of the light emitting layer forming portion which is in contact with the buffer layer.

More specifically, the substrate is made of a sapphire substrate and the buffer layer is made of $GaO_zN_{1-z}$ (0<z<1), and more specifically, the light emitting layer forming portion has a double heterojunction structure in which the active layer is interposed between an n-type semiconductor layer and a p-type semiconductor layer, and a semiconductor layer which is in contact with at least the buffer layer of the light emitting layer forming portion is made of a $GaO_zN_{1-z}$ (0<z<1) single crystal layer.

The buffer layer can contain at least one kind selected from a group including Si, Se, Te, Mg, Zn and Be.

According to the semiconductor light emitting device of the present invention, irrespective of the presence or not of the buffer layer and a material thereof, a gallium nitride based compound semiconductor including an n-type layer and a p-type layer to form a light emitting layer is provided on a substrate, thereby providing a light emitting layer forming portion, wherein at least one of semiconductor layers constituting the light emitting layer forming portion is formed by a compound semiconductor layer containing oxygen in a gallium nitride based compound. Consequently, the crystal defects of the semiconductor layer can be decreased, thereby enhancing a luminance.

A buffer layer made of AlN may be provided between the substrate and the light emitting layer forming portion and a buffer layer made of $AlO_uN_{1-u}$ (0<u<1) may be provided between the substrate and the light emitting layer forming portion.

Furthermore, the semiconductor light emitting device according to the present invention comprising a substrate, a buffer layer made of $AlO_uN_{1-u}$ (0<u<1) provided on the substrate, and a light emitting layer forming portion in which a gallium nitride based compound semiconductor including an n-type layer and a p-type layer to form a light emitting layer is provided on the buffer layer.

A part of Al of the buffer layer may be substituted for In, and the buffer layer may contain at least one kind selected from a group including Si, Se, Te, Mg, Zn and Be.

In the case where at least one of the semiconductor layers constituting the light emitting layer forming portion is made of $Ga_{1-x-y}Al_xIn_yO_zN_{1-z}$ (0≦x<1, 0≦y<1, 0<z<1), a luminance can be enhanced still more. More specifically, the substrate is formed of a sapphire substrate, and the light emitting layer forming portion has a double heterojunction structure in which an active layer is interposed between the n-type layer and the p-type layer.

The present invention provides a method of manufacturing a semiconductor light emitting device comprising the steps of providing a buffer layer made of a gallium nitride based compound semiconductor on a substrate at a low temperature by the Metal Organic Vapor Phased Epitaxy (MOVPE) method, the (Hydride Vapor Phased Epitaxy (HVPE) method or the Molecular Beam Epitaxy (MBE) method, sequentially providing semiconductor layers constituting a light emitting layer forming portion made of a gallium nitride based compound semiconductor at a high temperature, and supplying or while supplying an oxidizing source when growing the buffer layer and/or at least one of the semiconductor layers constituting the light emitting layer forming portion.

The oxidizing source can supply oxygen, ozone, $N_2O$, $H_2O$ and the like, and can liberate oxygen of oxide in a growing furnace such as a chamber made of a quartz glass.

As another manufacturing method, the present invention provides a method of manufacturing a semiconductor light emitting device comprising the steps of providing a buffer layer made of $AlO_uN_{1-u}$ (0<u<1) onto a substrate at a low temperature by the MOVPE method, the HVPE method or the MBE method by supplying or while supplying an oxidizing source, and sequentially epitaxially growing semiconductor layers constituting a light emitting layer forming portion made of a gallium nitride based compound semiconductor at a high temperature. In this case, the oxidizing source may be supplied when forming at least one layer of the light emitting layer forming portion or performing growth while supplying the oxidizing source and growing a semiconductor layer made of $Ga_{1-x-y}Al_xIn_yO_zN_{1-z}$ (0≦x<1, 0≦y<1, 0<z<1).

The oxidizing source may be supplied by introducing the oxidizing source into a growing furnace for growing the semiconductor layer or by using oxygen of oxide in the growing furnace for growing the semiconductor layer.

BEST MODE FOR CARRYING OUT THE INVENTION

Figure 1:
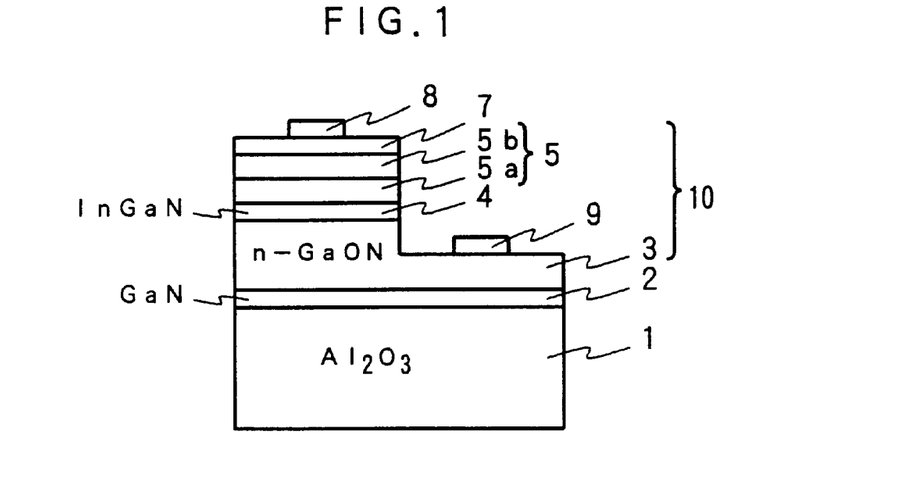
FIG. 1 is a sectional view showing a semiconductor light emitting device according to an embodiment of the present invention.

A semiconductor light emitting device according to the present invention comprises a buffer layer 2 made of a gallium nitride based compound semiconductor provided on the surface of a substrate 1 made of sapphire (an $Al_2O_3$ single crystal), for example, and a light emitting layer forming portion 10 in which gallium nitride based compound semiconductor layers including an n-type layer 3 and a p-type layer 5 to form a light emitting layer is provided on the buffer layer 2 as shown in a sectional view illustrating an embodiment in FIG. 1, for example. An example shown in FIG. 1 is characterized in that a semiconductor layer of the n-type layer 3 constituting the light emitting layer forming portion 10 is formed of a compound semiconductor containing oxygen in a gallium nitride based compound.

In the example shown in FIG. 1, the semiconductor layers provided on the sapphire substrate 1 have a structure in which a low-temperature buffer layer 2 made of GaN is deposited in a thickness of about 0.01 to 0.2 μm at a low temperature of about 500° C., an n-type layer (clad layer) 3 made of n-type $GaO_zN_{1-z}$ which has a thickness of about 1 to 5 μm at a high temperature of about 1000° C., an active layer 4 made of a non-doped InGaN based compound semiconductor which has a thickness of about 0.002 to 0.3 μm (if blue light is to be emitted, In has a rate of 0.3 to 0.5 and Ga has a rate of 0.7 to 0.5 with non-doping, and Si and Zn can be doped to cause the In to have a rate of about 0.05, thereby performing impurity light emission), and a p-type layer 5 having a p-type AlGaN based compound semiconductor layer 5a and a GaN layer 5b provided in a thickness of about 0.05 to 0.5 μm are sequentially grown, thereby providing a light emitting layer forming portion 10. A p-side electrode 8 is formed on the surface of the provided semiconductor layers through a current diffusion layer 7 made of an alloy layer of Ni and Au and having a thickness of about 2 to 100 nm, for example, and an n-type electrode 9 is formed on the n-type layer 3 exposed by removing a part of the provided semiconductor layers 3 to 5.

It is preferable that the rate of 0 of GaOzN1-z of the above-mentioned n-type layer 3, that is, the range of z should be 0.2 or more as will be described below. However, even if the range of z is 0.1, remarkable effects can be obtained. Therefore, the small range can be applied and the rate can be selected in the range of 0<z<1 based on the relationship with other layers.

In the example shown in FIG. 1, the p-type layer 5 is formed of a double layer having the GaN layer 5b and the AlGaN based compound semiconductor layer 5a because it is preferable that a layer containing Al should be provided on the active layer 4 side in respect of the confinement effect of a carrier and only the GaN layer may be provided. Moreover, the AlGaN based compound semiconductor layer may be provided on the n-type layer 3 to form a double layer, and these can also be formed of other gallium nitride based compound semiconductor layers. Furthermore, while the buffer layer 2 is also formed of the GaN layer, it may be formed of other semiconductor layers such as an AlN layer, an AlGaN based compound semiconductor layer, a layer to which In is added and the like.

Next, an enhancement in the luminance of the semiconductor light emitting device having the structure shown in FIG. 1 will be described below. As described above, the present inventors variously investigated to decrease, as much as possible, lattice defects generated on the gallium nitride based compound semiconductor layer constituting the light emitting layer forming portion provided on the sapphire substrate, thereby enhancing the luminance, for example. As a result, it has been found that the gallium nitride based compound semiconductor layer provided on the substrate containing oxygen, thereby greatly reducing a crystal defect density and highly enhancing the luminance.

Figure 2:
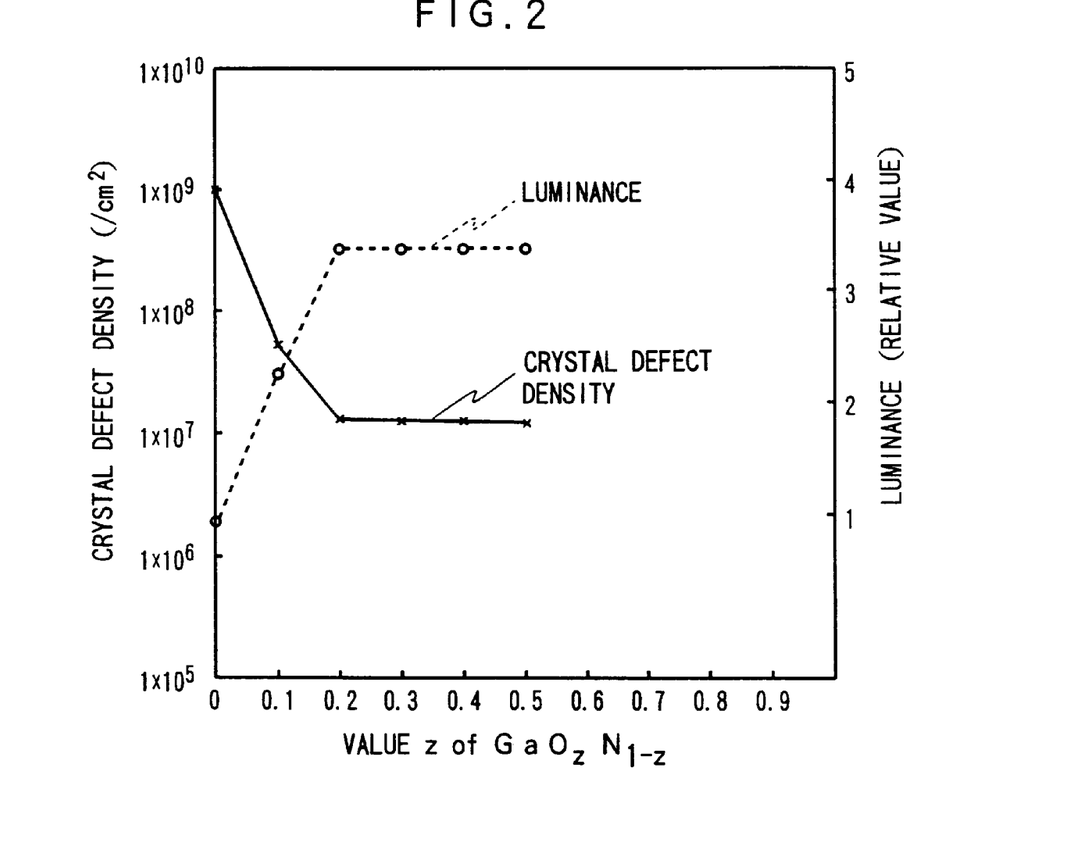
FIG. 2 is a chart showing a crystal defect density of an n-type layer obtained by changing an amount z of $GaO_zN_{1-z}$ of the n-type layer in FIG. 1 and a change in a luminance of the light emitting device.

More specifically, in the blue color type semiconductor light emitting device with the structure shown in FIG. 1, a change in a crystal defect density on the surface of the n-type layer 3 which is obtained by changing the amount (z) of oxygen of the n-type layer 3 made of $GaO_zN_{1-z}$ and a change in the luminance obtained in the state of the light emitting device were checked. As a result, when the oxygen was contained at a rate of z of about 0.1, the crystal defect density and the luminance were greatly enhanced. When z has a value of 0.2 or more, the crystal defect density was enhanced by about 2 orders and the luminance was enhanced by three times or more as shown in FIG. 2. In FIG. 2, A denotes a crystal defect density and B denotes a luminance. The n-type layer 3 had a thickness of 5 μm, the buffer layer 2 was made of GaN in a thickness of about 0.03 μm, the active layer 4 was made of $In_{0.05}Ga_{0.95}N$ doped with Si and Zn in a thickness of about 0.2 μm, and the p-type layer 5 had a lamination structure including the $Al_{0.15}Ga_{0.85}N$ layer 5a in a thickness of 0.2 μm and the GaN layer 5b in a thickness of about 0.3 μm, and only the value of z was changed for manufacture. The crystal defect density was measured by an etch pit method for measuring the number of pits which are dents generated by etching the surface of the provided n-type layer 3 without providing a semiconductor layer such as a next active layer. A luminance was measured in the state in which the n-type layer 3 was provided and the active layer 4, the p-type layer 5 and the like were continuously provided to make a semiconductor light emitting device, and is a result of the relative luminance obtained by setting a luminance to 1 when the conventional n-type layer is made of GaN.

Figure 3:
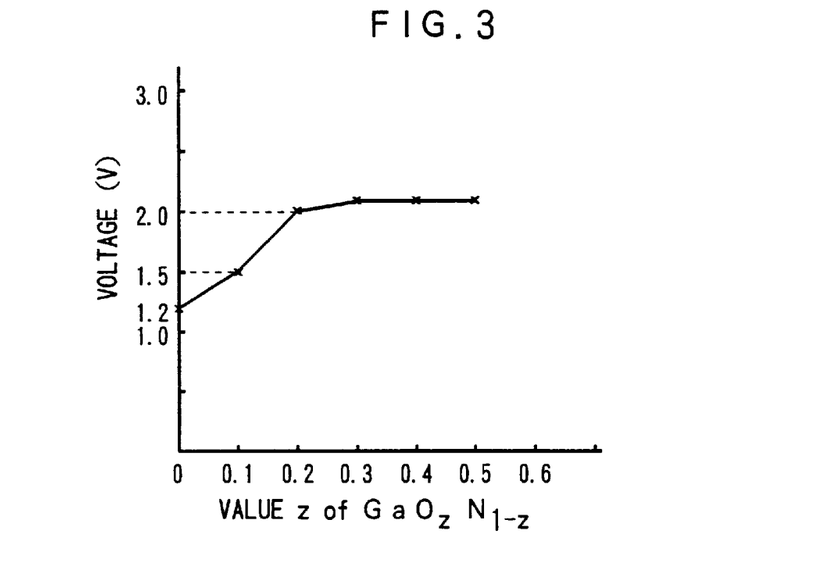
FIG. 3 is a chart showing a voltage at a predetermined leakage current obtained by changing the amount z of $GaO_zN_{1-z}$ of the n-type layer with the structure in FIG. 1, the voltage is obtained when a current value becomes to the predetermined value when the voltage is increased.
Figure 6:
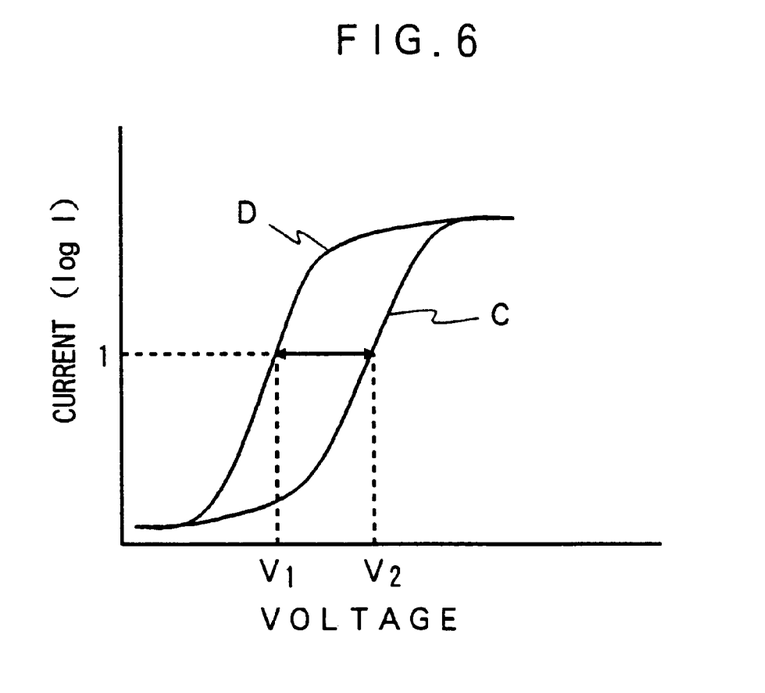
FIG. 6 is a voltage to current characteristic chart showing a rising portion which is obtained when a voltage is applied, for explaining a leakage current of the semiconductor light emitting device.

This phenomenon in which less crystal defects are generated could also be confirmed by measuring a leakage current of the semiconductor light emitting device. More specifically, the characteristic of a voltage (V) and a current (log I (logarithmic scale)) of the semiconductor light emitting device is generally identical to the characteristic shown by C of FIG. 6. Even if the voltage of the V–log I characteristic is raised, the current is saturated and is not increased. It becomes almost constant by depending on the resistance of the contact portion of electrodes. However, the V–log I characteristic of the semiconductor light emitting device having a great leakage current rises quickly as shown by D. For this reason, it is apparent that a lower voltage (a curve D indicative of V1has a greater leakage current by measuring voltage V1 and V2 with a constant current value (for example, 1 μA) log I1. As shown in FIG. 3, a voltage is plotted with a constant current by using z of the above-mentioned $GaO_zN_{1-z}$ as a parameter. It is also apparent from FIG. 3 that oxygen is contained to generate a smaller leakage current (a high voltage with a constant current) than the GaN layer having z of 0.

As is apparent from FIGS. 2 and 3, the n-type layer 3 contains oxygen so that the number of crystal defects is greatly decreased and a luminance is also enhanced. The $GaO_zN_{1-z}$ is dominantly grown more quickly in a transverse direction than in a vertical direction as compared with the GaN. Therefore, it is believed that a film having less defects can be grown because the film is connected in the transverse direction and becomes a flat film and is grown in the vertical direction. When a flat film having less defects is formed, a film grown thereon also has less defects and is flat. Therefore, flat films having less defects are formed for the active layer and the p-type layer. Thus, a semiconductor light emitting device having a high luminance can be obtained. For this reason, it is guessed that in the case where the oxygen is to be added to only one layer, the oxygen is preferably added as lower as possible (to the side closer to the substrate).

Figure 4:
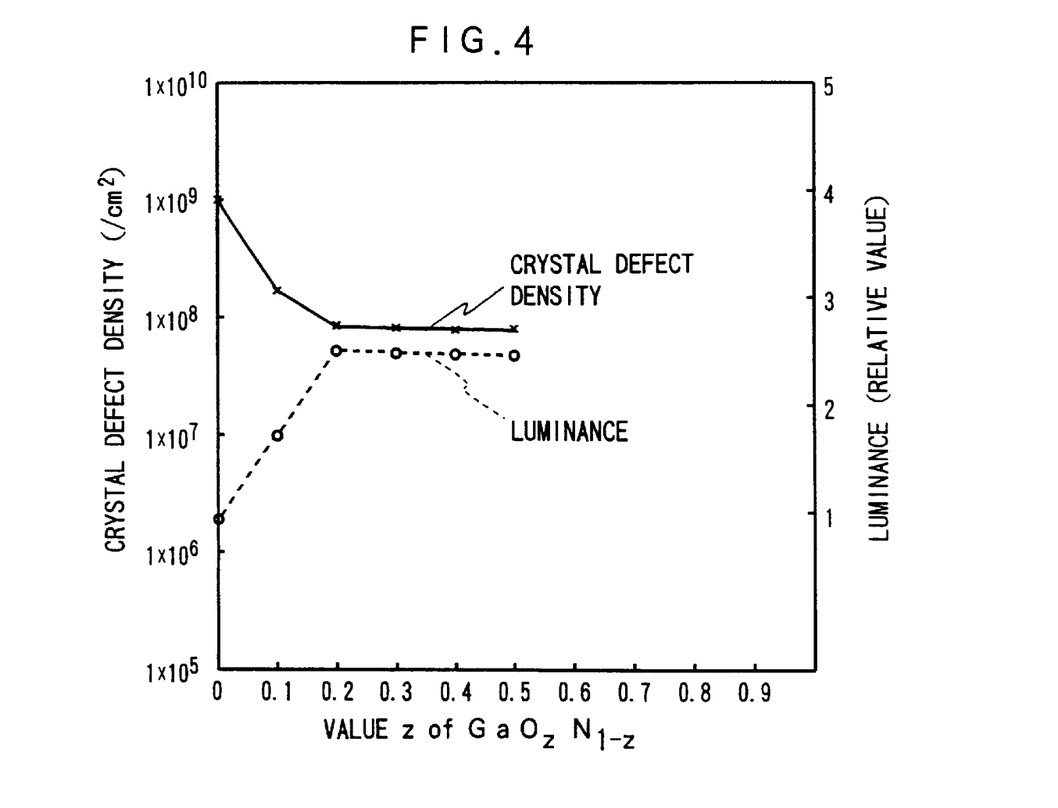
FIG. 4 is a chart showing a change in a crystal defect density of the n-type layer obtained by changing the amount z of $GaO_zN_{1-z}$ for a buffer layer and a change in a luminance of the light emitting device.

From this viewpoint, the state of the crystal defect of the n-type layer and the change of the luminance were similarly investigated by causing the buffer layer 2 formed at a low temperature to contain oxygen in place of the n-type layer epitaxially grown at a high temperature. More specifically, a film having a thickness of about 0.03 µm was formed at a temperature of about 500° C. by using $GaO_zN_{1-z}$ for the buffer layer 2, by variously changing the value of z of the buffer layer 2, the n-type layer 3 was formed of n-type GaN in a thickness of about 5 µm, and the active layer 4 and the p-type layer 5 were in the same manner as the above-mentioned example. The density of the crystal defect and the luminance of the light emitting device were checked by using the $GaO_zN_{1-z}$ for the buffer layer 2. The result of the checking is shown in FIG. 4. Also in FIG. 4, A denotes a crystal defect density and B denotes a luminance. The crystal defect density was obtained by an etch pit method in which the n-type layer 3 is epitaxially grown on the buffer layer 2 and is etched in the same manner as the foregoing, thereby checking the number of pits. The luminance was checked with a relative value on the basis of a luminance obtained by using the GaN for the buffer layer in the state in which the light emitting device is made as described above. In the same manner as the foregoing, FIG. 5 shows the relationship of a voltage obtained with a constant current indicative of a leakage current in the light emitting device.

Figure 5:
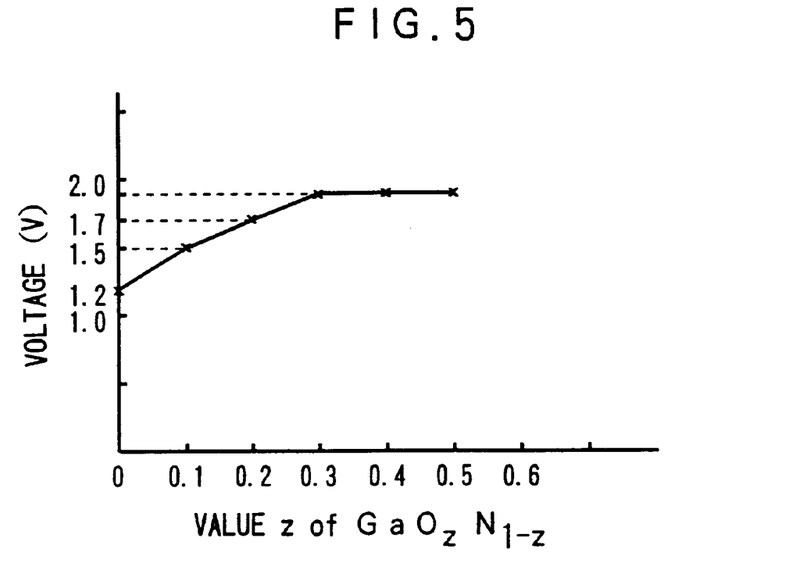
FIG. 5 is a chart showing a voltage at a predetermined leakage current obtained by changing the amount z of $GaO_zN_{1-z}$ to be used for the buffer layer, the voltage is obtained when a current value becomes the predetermined value when the voltage is increased.

As is apparent from FIGS. 4 and 5, the crystal defect density is decreased and the luminance is also enhanced by using the $GaO_zN_{1-z}$ having oxygen added thereto for the buffer layer, although the crystalline properties are lowered than the case where the $GaO_zN_{1-z}$ is used for the above-mentioned n-type layer. However, the present structure is clearly more enhanced than the conventional structure. This can be considered as follows. More specifically, since the buffer layer 2 is grown at a low temperature, it is believed that the buffer layer 2 does not become a single crystal during growth but is set in an amorphous state, so a layer having less crystal defects with a dense film such as the single crystal layer of the $GaO_zN_{1-z}$ is obtained with difficulty even if the buffer layer 2 contains oxygen. However, at least the surface of the buffer layer 2 is changed into a single crystal during the growth of the next n-type layer 3 at a high temperature. Since the single crystal layer contains oxygen, it is a dense layer having less crystal defects and a single crystal layer to be formed thereon is also provided in alignment with the layer having less crystal defects on the surface of the buffer layer. Consequently, it is believed that a semiconductor layer having less crystal defects can be obtained. As a result, a gallium nitride based compound semiconductor containing oxygen can be used for the buffer layer. Consequently, even if a semiconductor layer to be provided on the buffer layer is a gallium nitride based compound semiconductor layer containing no oxygen, a semiconductor light emitting device having less crystal defects and a high luminance can be obtained.

As a matter of course, the gallium nitride based compound semiconductor containing oxygen is used for both the buffer layer and the semiconductor layer of the light emitting layer forming portion. Consequently, the crystal defects can be decreased still more and the luminance can be enhanced. Furthermore, the luminance could be enhanced still more by adding oxygen to the active layer of the light emitting layer forming portion having the above-mentioned structure.

The present inventors also investigated crystalline properties obtained in the case where an oxidizing source is supplied to form an AlN film with a composition of $AlO_uN_{1-u}$ ($0<u<1$) containing oxygen when AlN is to be used for the buffer layer. In this case, the light emitting layer forming portion 10 had the same structure as in the case where $GaO_zN_{1-z}$ is used for the above-mentioned buffer layer 2. The buffer layer 2 was formed in a thickness of about 0.03 µm at a low temperature of about 500° C. Also in this case, the defect density was lowered by about two orders with the rate of the oxygen to be contained in the same manner as in the case where the above-mentioned $GaO_zN_{1-z}$ was used for the buffer layer 2, that is, a value of u of about 0.2 and the luminance was remarkably increased, thereby it is supposed to obtain the same effects with other values of u. In the same manner as in the above-mentioned $GaO_zN_{1-z}$, since the buffer layer 2 is grown at a low temperature, it does not become a single crystal during the growth but is set in an amorphous state of $AlO_uN_{1-u}$. It is supposed that a layer having less crystal defects with a dense film such as a single crystal layer can be obtained with difficulty. However, it is supposed that at least the surface of the buffer layer 2 is changed into a single crystal and becomes dense during the growth of the next n-type layer 3 at a high temperature and a semiconductor layer having less crystal defects is provided as described above. As a result, the $AlO_uN_{1-u}$ containing oxygen is used for the buffer layer 2. Consequently, a gallium nitride based compound semiconductor layer provided on the buffer layer 2 has less crystal defects. Thus, a semiconductor light emitting device having a high luminance can be obtained. It is preferable that the thickness of the buffer layer 2 should be 0.01 to 0.2 µm in the same manner as the foregoing in order to get the buffer function.

In order to obtain the gallium nitride based compound semiconductor layer having less crystal defects by flattening the surface of the sapphire substrate, there has been known a method in which the surface of the sapphire substrate is nitrided to obtain $Al_2(ON)_3$ and a low-temperature buffer layer made of GaN is formed on the $Al_2(ON)_3$ and a gallium nitride based compound semiconductor is provided on the buffer layer. Also in this case, however, the surface of the sapphire substrate is nitrided to make $Al_2(ON)_3$ and the buffer layer is a GaN layer grown at a low temperature. Even if the surface of the sapphire substrate is flattened, a dense film is not formed in the same manner as the direct formation of the GaN layer on the sapphire substrate. In addition, the gallium nitride based compound semiconductor layer grown on the GaN layer at a high temperature is not changed into a dense film as in the present invention.

Next, a method for manufacturing a semiconductor light emitting device shown in FIG. 1 will be described below.

By the MOVPE method, a reaction gas such as trimethyl gallium (TMG), ammonia ($NH_3$) or the like is supplied together with a carrier gas $H_2$. First of all, a low-temperature buffer layer 2 made of a GaN layer is formed on a sapphire substrate 1 in a thickness of about 0.01 to 0.2 µm at a temperature of about 400 to 600° C. for example.

Then, $SiH_4$ or the like acting as an n-type dopant gas, and furthermore, $O_2$ acting as an oxidizing source are added to the above-mentioned reaction gas at a high temperature of about 600 to 1200° C., for example, and an n-type layer 3 made of n-type $GaO_zN_{1-z}$ is grown in a thickness of about 1 to 5 µm. Thereafter, trimethyl indium (hereinafter referred to as TMIn) is added to the reaction gas, dimethyl zinc (DMZn) is further added to the $SiH_4$ of the dopant gas, and the active layer 4 made of an InGaN based compound semiconductor doped with Si and Zn is formed in a thickness of about 0.002 to 0.3 µm. Subsequently, trimethyl aluminum (hereinafter referred to as TMA) is introduced in place of the TMIn, and cyclopentadienyl magnesium ($Cp_2Mg$) or dimethyl zinc (DMZn) are further used as the dopant gas, thereby growing a p-type AlGaN based compound semiconductor layer 5a in a thickness of about 0.05 to 0.5 μm, then stopping the introduction of the TMA to grow p-type GaN in a thickness of about 0.05 to 0.5 μm, and forming the p-type layer 5 in a thickness of about 0.1 to 1 μm as a whole.

Then, for example, Ni and Au are provided by vacuum deposition or the like and is sintered and alloyed. Consequently, a current diffusion layer 7 is formed in a thickness of about 2 to 100 nm. Thereafter, a resist film is provided on a surface and is patterned. A part of the laminated semiconductor layers is removed by reactive ion etching using a chlorine gas or the like, thereby exposing the n-type layer 3. By the lift off method, for example, Ti and Al are provided and sintered to be electrically connected to the n-type layer 3 by the lift off method. Consequently, an n-side electrode 9 made of an alloy layer of both metals is formed. For example, similary, Ti and Au are provided to be electrically connected to the p-type layer 5. Thus, a p-side electrode 8 having a lamination structure of both metals is formed. As a result, the semiconductor light emitting device shown in FIG. 1 can be obtained.

While the semiconductor layer has been grown by the MOVPE method in this example, the same semiconductor layer can also be grown by the HVPE method or the MBE method. Although $O_2$ has been used for the oxidizing source, it is not restricted thereto but a material capable of performing oxidation can be used. Accordingly, it is also possible to utilize oxygen liberated from oxide such as $N_2O$, $H_2O$ or a quartz glass in a growing furnace or oxygen which can be liberated by introducing a reducing agent, and the like.

Although the GaN layer has been used for the gallium nitride based compound semiconductor layer to be contained oxygen in each of the above-mentioned examples, the same results could be obtained by using a mixed crystal gallium nitride based compound semiconductor to which another III group element is added, for example, an AlGaN based compound semiconductor layer, an InGaN based compound semiconductor layer or the like.

Furthermore, while the buffer layer has been formed with non-doping in the above-mentioned example, an n-type impurity such as Si, Se, Te or the like may be introduced to obtain an n-type or a p-type impurity such as Mg, Zn, Be or the like may be introduced to obtain a p-type, thereby growing the p-type layer of the light emitting layer forming portion earlier. Moreover, while the n-type layer of the light emitting layer forming portion contains oxygen in the above-mentioned example, the p-type layer and the non-doped layer may contain the oxygen. In particular, in the structure in which the p-type layer is formed on the substrate side, the active layer and the n-type layer are provided on the p-type layer so that the light emitting layer forming portion is provided, it is preferable that the p-type layer should contain oxygen in such a manner that the p-type layer is a lower layer. In brief, the present invention can be applied to the compound semiconductor layer containing Ga and N.

Although GaN, $GaO_zN_{1-z}$ and $AlO_zN_{1-z}$ have been used for the buffer layer in the example, effects can be obtained even if the buffer layer has another composition such as AlN when the gallium nitride based compound semiconductor containing oxygen is used for the light emitting layer forming portion. Also in the case where $AlO_zN_{1-z}$ is used for the buffer layer, the same effects can be obtained with a structure in which a part of Al is substituted for another III group element such as In and a structure in which the above-mentioned n-type impurity and/or p-type impurity are is added.

Furthermore, while the sapphire substrate has been used for the substrate in the above-mentioned example, the sapphire substrate is not restricted but the present invention can be applied to the case where the gallium nitride based compound semiconductor is provided on other semiconductor substrates such as a SiC substrate, a Si substrate, a GaAs substrate and the like.

Although the active layer has been formed by Si an Zn doping in each of the above-mentioned examples, it may be formed by non-doping. Furthermore, while there has been an example of a double heterojunction structure in which the active layer is interposed between the n-type layer and the p-type layer as the light emitting layer forming portion, the same effects can be obtained with a pn junction structure in which the n-type layer and the p-type layer are directly joined.

According to the present invention, also in the case where the gallium nitride based compound semiconductor layer is grown on a substrate having different lattice constants, the crystalline properties of the semiconductor layer in the light emitting layer forming portion are greatly be enhanced because at least one of the gallium nitride based compound semiconductor layers and/or the GaN based or AlN based compound semiconductor of the buffer layer contain(s) oxygen. As a result, a luminance is increased, and a variation is reduced in respect of manufacture. Thus, it is possible to obtain an inexpensive blue color type semiconductor light emitting device having a high luminance.

INDUSTRIAL APPLICABILITY

According to the semiconductor light emitting device of the present invention, blue color (B) type light having a high luminance can be obtained and can be utilized as various blue color type light sources, and is used together with red color (R) and green color (G) light emitting devices, thereby obtaining light sources having any mixed color. Thus, the semiconductor light emitting device can be utilized in a variety of fields such as a traffic light, a display unit such as a large-sized display and the like.

What is claimed is:

1. A semiconductor light emitting device comprising:
   a substrate;
   a buffer layer provided on said substrate and made of a gallium nitride based compound semiconductor; and
   a light emitting layer forming portion in which gallium nitride based compound semiconductor layers including an n-type layer and a p-type layer to form a light emitting layer are provided on said buffer layer;
   wherein at least one of said buffer layer and said semiconductor layers constituting said light emitting layer forming portion is a compound semiconductor which contains oxygen as an element constituting the compound in a gallium nitride based compound.

2. The semiconductor light emitting device of claim 1, wherein said compound semiconductor containing oxygen is made of $Ga_{1-x-y}Al_xIn_yO_zN_{1-z}$ ($0 \leq x < 1$, $0 \leq y < 1$, $0 < z < 1$).

3. The semiconductor light emitting device of claim 2, wherein said compound semiconductor containing oxygen contains at least one of an n-type impurity and a p-type impurity.

4. The semiconductor light emitting device of claim 1, wherein said compound semiconductor containing oxygen is used for said buffer layer.

5. The semiconductor light emitting device of claim 1, wherein said compound semiconductor containing oxygen is used for a semiconductor layer on at least a buffer layer side of said light emitting layer forming portion.

6. The semiconductor light emitting device of claim 1, wherein said light emitting layer forming portion has a double heterojunction structure in which an active layer is interposed between said n-type layer and said p-type layer, and said compound semiconductor containing oxygen is used for said active layer.

7. The semiconductor light emitting device of claim 4, wherein said substrate is made of a sapphire substrate and said buffer layer is made of $GaO_zN_{1-z}$ (0<z<1).

8. The semiconductor light emitting device of claim 7, wherein said buffer layer contains at least one kind selected from a group including Si, Se, Te, Mg, Zn and Be.

9. The semiconductor light emitting device of claim 5, wherein said light emitting layer forming portion has a double heterojunction structure in which an active layer is interposed between said n-type semiconductor layer and said p-type semiconductor layer, and a semiconductor layer which is in contact with at least said buffer layer of said light emitting layer forming portion is made of a $GaO_zN_{1-z}$ (0<z<1) single crystal layer.

10. A semiconductor light emitting device comprising:
    a substrate;
    a light emitting layer forming portion in which gallium nitride based compound semiconductor layers including an n-type layer and a p-type layer to form a light emitting layer are provided on said substrate;
    wherein at least one of said semiconductor layers constituting said light emitting layer forming portion is a compound semiconductor layer which contains oxygen in a gallium nitride based compound.

11. The semiconductor light emitting device of claim 10, wherein a buffer layer made of AlN is provided between said substrate and said light emitting layer forming portion.

12. The semiconductor light emitting device of claim 10, wherein a buffer layer made of $AlO_uN_{1-u}$ (0<u<1) is provided between said substrate and said light emitting layer forming portion.

13. A semiconductor light emitting device comprising:
    a substrate;
    a buffer layer made of $AlO_uN_{1-u}$ (0<u<1) provided on said substrate; and
    a light emitting layer forming portion in which gallium nitride based compound semiconductor layers including an n-type layer and a p-type layer to form a light emitting layer is provided on said buffer layer.

14. The semiconductor light emitting device of claim 13, wherein said buffer layer further comprises in.

15. The semiconductor light emitting device of claim 13, wherein said buffer layer contains at least one kind selected from a group including Si, Se, Te, Mg, Zn and Be.

16. The semiconductor light emitting device of claim 13, wherein at least one of said semiconductor layers constituting said light emitting layer forming portion is made of $Ga_{1-x-y}Al_xIn_yO_zN_{1-z}$ (0≦x<1, 0≦y<1, 0<z<1).

17. The semiconductor light emitting device of claim 16, wherein said substrate is formed of a sapphire substrate, and said light emitting layer forming portion has a double heterojunction structure in which an active layer is interposed between said n-type layer and said p-type layer.

18. A method of manufacturing a semiconductor light emitting device comprising the steps of:
    providing a buffer layer made of a gallium nitride based compound semiconductor on a substrate by the MOVPE method, the HVPE method or the MBE method;
    sequentially providing semiconductor layers constituting a light emitting layer forming portion made of a gallium nitride based compound semiconductor; and
    supplying or while supplying an oxidizing source when growing a semiconductor layer containing oxygen as an element constituting compound, said semiconductor layer being at least one of said buffer layer and said semiconductor layers constituting said light emitting layer forming portion.

19. A method of manufacturing a semiconductor light emitting device comprising the steps of:
    providing a buffer layer made of $AlO_uN_{1-U}$ (0<u<1) onto a substrate by the MOVPE method, the HVPE method or the MBE method by supplying or while supplying an oxidizing source; and
    sequentially epitaxially growing semiconductor layers constituting a light emitting layer forming portion made of a gallium nitride based compound semiconductor.

20. The manufacturing method of claim 19, wherein growing at least one layer of said light emitting layer forming portion by supplying or while supplying an oxidizing source and growing a semiconductor layer made of $Ga_{1-x-y}Al_xIn_yO_zN_{1-z}$ (0≦x<1, 0≦y<1, 0<z<1).

21. The manufacturing method of claim 18, wherein said oxidizing source is supplied by introducing the oxidizing source into a growing furnace for growing said buffer layer or said semiconductor layers.

22. The manufacturing method of claim 18, wherein said oxidizing source is supplied by an oxide in a growing furnace for growing said buffer layer or said semiconductor layers.

* * * * *